United States Patent [19]
O'Connor

[11] 3,956,880
[45] May 18, 1976

[54] SOLID STATE WRISTWATCH WITH CHARGE COUPLED DIVIDER

[75] Inventor: Arthur H. O'Connor, Lancaster, Pa.

[73] Assignee: Time Computer, Inc., Lancaster, Pa.

[22] Filed: Oct. 18, 1973

[21] Appl. No.: 407,583

[52] U.S. Cl. .............................. 58/23 B; 58/50 R; 307/221 C; 328/44; 331/116 R
[51] Int. Cl.² .................. G04C 3/00; G04B 19/30; H03K 21/02; H03F 3/02
[58] Field of Search ............. 58/23 R, 50 R, 23 AC, 58/23 A; 307/221–225; 328/44; 331/116

[56] References Cited
UNITED STATES PATENTS

| | | | |
|---|---|---|---|
| 3,643,106 | 2/1972 | Berwin et al. | 307/221 C |
| 3,672,155 | 6/1972 | Bergey et al. | 58/50 R |
| 3,757,510 | 9/1973 | Dill | 58/50 R X |
| 3,763,480 | 10/1973 | Weimer | 307/221 C |
| 3,772,874 | 11/1973 | Lefkowitz | 340/336 X |
| 3,783,306 | 4/1972 | Hoffmann | 307/221 C |
| 3,792,465 | 2/1974 | Collins et al. | 340/168 S X |
| 3,848,200 | 11/1974 | Luscher | 331/116 R |

OTHER PUBLICATIONS

Eleccion, "The Electronic Watch", IEEE Spectrum, Vol. 10, No. 4, April 1973, pp. 24–32.
Kosonocky et al., "Charge-Coupled Digital Circuits", IEE Journal of Solid-State Circuits, Vol. SC-6, No. 5, Oct. 1971.

*Primary Examiner*—Edith Simmons Jackmon
*Attorney, Agent, or Firm*—LeBlanc and Shur

[57] ABSTRACT

This invention relates to a solid state timepiece and more particularly to an electronic watch which employs no moving parts. In the present invention a frequency standard in the form of a crystal oscillator acts through a solid state electronic circuit divider and display actuator to power in timed sequence the light-emitting diodes of an electro-optic display. Low cost, low power consumption and small size and weight are achieved through the use of a charge coupled binary divider chain.

10 Claims, 7 Drawing Figures

FIG. 5
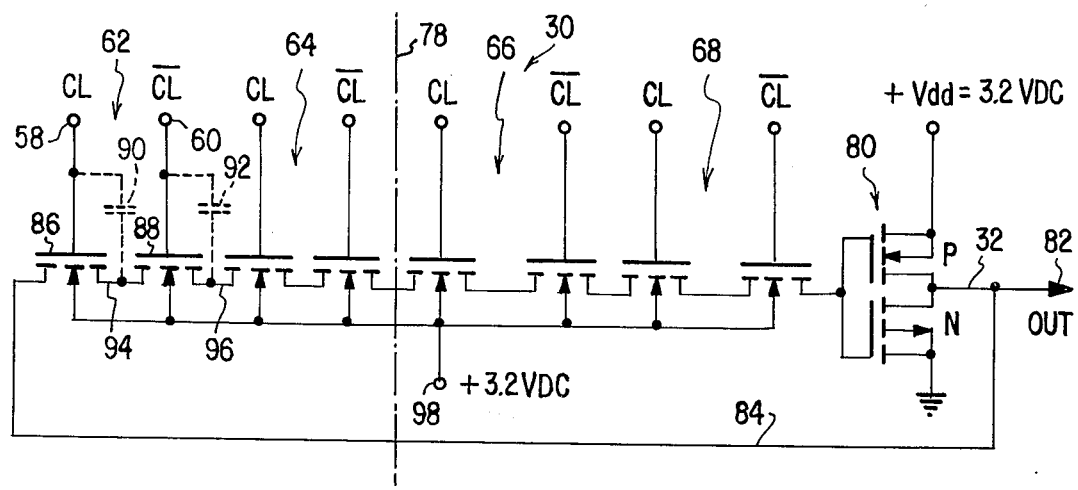
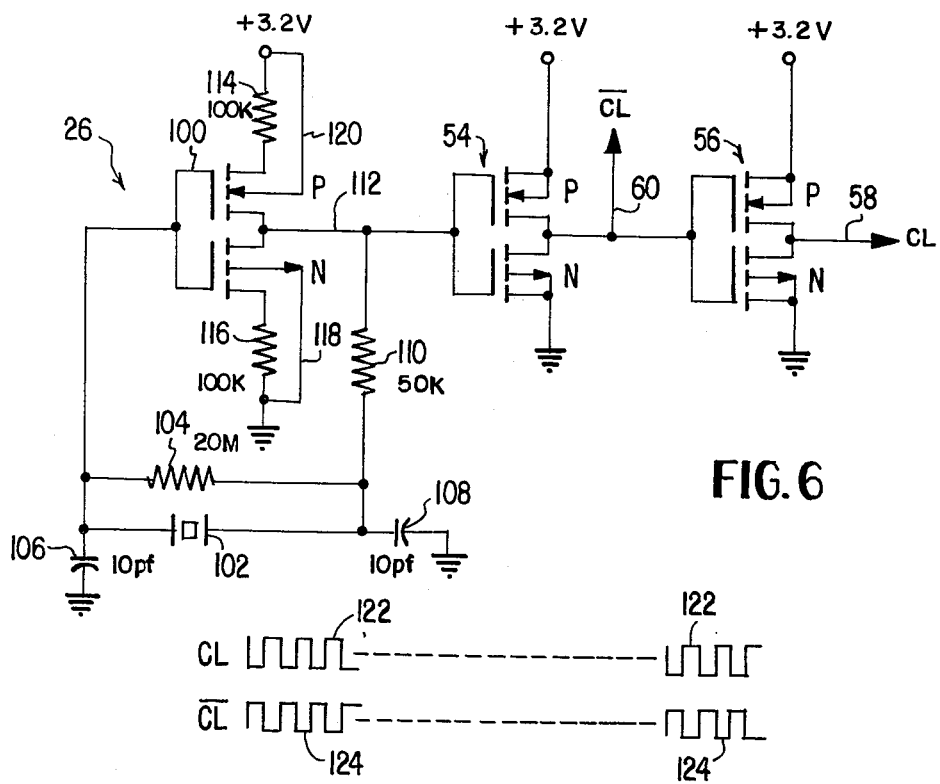
FIG. 6
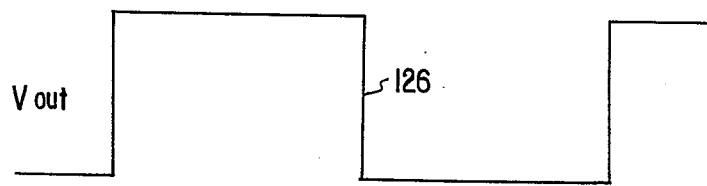
FIG. 7

SOLID STATE WRISTWATCH WITH CHARGE COUPLED DIVIDER

Battery powered wristwatches and other small portable timekeeping devices of various types are well known and are commercially available. One such device which has proven to be quite successful commercially is shown and described in assignee's U.S. Pat. No. Re. 26,187 reissued Apr. 4, 1967 to John A. Van Horn for Electric Watch.

In more recent years, considerable effort has been directed toward the development of high accuracy wristwatches which do not employ electro-mechanical oscillators as the master time reference. Watches of this type generally employ a quartz crystal oscillator as the basic time standard with the high frequency output of the oscillator reduced to conventional time display frequencies by means of a frequency converter generally in the form of a binary divider chain. A timekeeping device of this type incorporating a frequency divider formed from complementary symmetry MOS transistors and having sufficiently small size and power consumption for use as a wristwatch is disclosed in assignee's U.S. Pat. No. 3,560,998. A wristwatch of this same general type employing as display elements light-emitting diodes which are energized only upon demand by the wearer is disclosed in assignee's U.S. Pat. No. 3,576,099. A complete solid state watch having a light-emitting diode display and with no moving parts in the wristwatch is disclosed in assignee's U.S. Pat. No. 3,672,155.

Complementary symmetry MOS transistors have proven quite satisfactory for use as the basic active circuit component in solid state wristwatches, especially when formed using large scale integrated circuit techniques. However, as is well known, CMOS integrated circuits are more complex and therefore more expensive to manufacture than are the more conventional PMOS or NMOS integrated circuits. Whereas the manufacture of PMOS and NMOS integrated circuit transistors may typically require only about three overlays conventional CMOS technology as presently practiced calls for upwards of seven overlays during the manufacturing operation. This introduces problems with respect to obtaining exact registry of each overlay on the integrated circuit chip which increases the cost of the CMOS circuit. In addition, it is not possible at the present time to obtain the same circuit density with CMOS as with PMOS or NMOS. That is, more transistors per circuit chip area may be obtained with PMOS and NMOS integrated circuits than can be obtained with CMOS.

The present invention avoids these and other difficulties by providing an integrated circuit frequency divider having sufficiently small size and power consumption for use in a wristwatch but at the same time one which can be manufactured using the cheaper PMOS or NMOS integrated circuit. The frequency divider of the present invention comprises a cascaded chain of PMOS or NMOS devices in a structure commonly referred to as charge coupled. In this configuration a two phase clock signal, Q1 and Q2, causes sequential progression of a charge from device to device. When the output of the chain is sent through an inverter stage and back to the input, a dividing action will occur where the output frequency from the inverter is ½ $n$ times the input frequency and $n$ is the number of PMOS or NMOS stages in the chain. A charge coupled divider such as this minimizes power consumption in that there is no connection of the devices to the power supply as in the usual dynamic or static CMOS, NMOS and PMOS dividers; instead the devices are connected solely for the purpose of charge transfer. Charge is initially introduced into the divider chain by an inverter connected to the last stage of the divider. A feedback path connects the inverter output to the input of the first divider stage and charge is transferred along the divider by a two phase system of clock and clock pulses derived from the oscillator output. The transfer of charge produces a voltage wave front or voltage step signal which advances down the divider chain at the frequency of the clock pulses until it reaches the end of the chain, is inverted and reapplied as an opposite voltage step function to the first stage of the divider to be again propelled down the chain at the clock frequency.

Although the charge coupled divider of the present invention can be made using CMOS transistors and is fully compatible with CMOS, an important feature of the present invention resides in the fact that the charge coupled divider may be formed from the cheaper PMOS or NMOS transistor chips. In addition to low cost and ease of manufacture, the charge coupled divider of the present invention makes possible the use of higher frequency crystals with their attendant increased accuracy and reliability and smaller size, all of which are desirable in the small physical confines of a conventional man's wristwatch. Because of its reduced size, the high frequency crystal takes up less space in the wristwatch and exhibits better temperature stability and greater shock resistance.

It is therefore one object of the present invention to provide an improved solid state wristwatch.

Another object of the present invention is to provide a wristwatch having an improved solid state divider.

Another object of the present invention is to provide a divider for a wristwatch of more simplified and less expensive construction.

Another object of the present invention is to provide a charge coupled solid state divider having sufficiently small size and power consumption for use in a wristwatch.

Another object of the present invention is to provide a wristwatch divider which can be manufactured from CMOS, PMOS, or NMOS integrated circuits.

Another object of the present invention is to provide an improved wristwatch having a charge coupled divider which makes possible the use of higher frequency and smaller size crystals in the crystal oscillator time standard.

Another object of the present invention is to provide a wristwatch divider which can be simply and inexpensively manufactured using conventional large scale integrated circuit techniques.

These and further objects and advantages of the invention will be more apparent upon reference to the following specification, claims and appended drawings wherein:

FIG. 5 is a detailed circuit diagram of a PMOS charge coupled divider constructed in accordance with this invention;

FIG. 6 is a detailed circuit diagram of an oscillator including a clock pulse generator useable with the divider of FIG. 5; and FIG. 7 shows the output and clock pulse voltage waveforms for the divider and oscillator of FIGS. 5 and 6.

Figure 1:
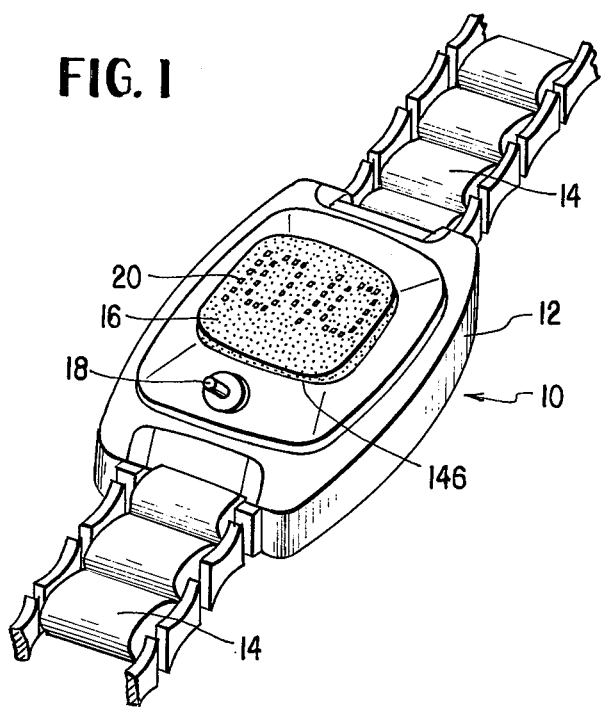
FIG. 1 is perspective view of a conventional size man's wristwatch constructed in accordance with the present invention.

Referring to the drawings, the novel watch of the present invention is generally indicated at 10 in FIG. 1. The watch is constructed to fit in a watch case 12 of approximately the size of a conventional man's wristwatch. The case 12 is shown connected to a wristwatch bracelet 14 and includes a display window 16 through which time is displayed in digital form as indicated at 20. The window may desirably be closed off by a red light filter to enhance the display. Mounted on the case 12 is a pushbutton demand switch 18 by means of which the display 20 may be actuated when the wearer of the wristwatch 10 desires to ascertain the time.

In normal operation, time is continuously being kept but is not displayed through the window 16. That is, no time indication is visible through the window and this is the normal condition which prevails in order to conserve battery energy in the watch. However, even though the time is not displayed through the window 16, it is understood that the watch 10 continuously keeps accurate time and is capable of accurately displaying this time at any instant. When the wearer desires to ascertain the correct time, he depresses the button 18 with his finger and the correct time immediately is displayed at 20 through the window 16, which shows a light-emitting diode display giving the correct time reading of 10:10, namely, 10 minutes after 10 o'clock. The hours and minutes, i.e., 10:10, are displayed through the window 16 for a predetermined length of time, preferably 1¼ seconds, irrespective of whether or not the pushbutton 18 remains depressed. The exact time of the display is chosen to give the wearer adequate time to consult the display to determine the hour and minute of time. Should the minutes (or hours) change during the time of display, this change is immediately indicated by advancement of the minute (or hour) reading to the next number, i.e., eleven, as the watch is being read. If the pushbutton 18 remains depressed, at the end of the 1¼ seconds the hours and minutes of the display are extinguished, i.e., they disappear, and simultaneously the seconds reading is displayed through the window 16. The advancing seconds cycling from 0 to 59 continue to be displayed through window 16 until the pushbutton 18 is released.

Figure 2:
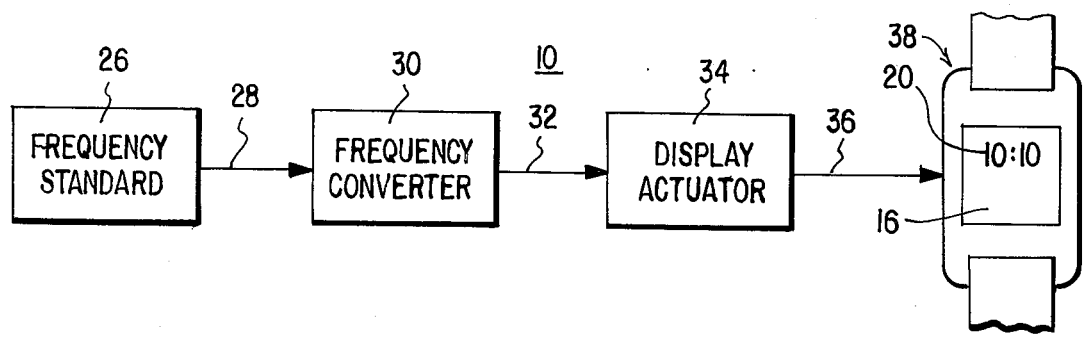
FIG. 2 is a simplified block diagram showing the principal components of the wristwatch of FIG. 1.

FIG. 2 is a simplified block diagram of the principal components of the watch 10 of FIG. 1. The watch comprises a time base or frequency standard 26, preferably chosen to produce an electrical output signal on lead 28 at a frequency of 32,768 Hz. This relatively high frequency is supplied to a frequency converter 30 in the form of a divider which divides down the frequency from the standard 26 so that the output from the converter 30 appearing on lead 32 is at a frequency useable to drive the display such as 1 Hz. This signal is applied to the display actuator 34 which in turn drives the display 20 of the watch by way of electrical lead 36. While only an hours and minutes display is shown, it is understood as previously described that the hours and minutes are first displayed for a predetermined time and if the pushbutton remains depressed, the hours and minutes are extinguished and the seconds become visible. These same display diodes are preferably used for both minutes and seconds since these are not displayed simultaneously, thus minimizing the power drain from the watch battery. For a more detailed description of the physical construction and mode of operation of the watch of the present invention, reference may be had to assignee's U.S. Pat. No. 3,672,155 or to the large scale integrated version of the wristwatch in assignee's copending application Ser. No. 143,492 filed May 14, 1971, now U.S. Pat. No. 3,760,584, the disclosure of which is incorporated herein by reference. See also U.S. Pat. Nos. 3,759,031 and 3,803,827.

Figure 3:
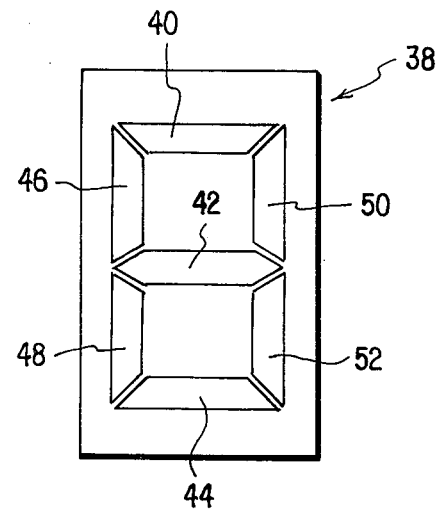
FIG. 3 shows a seven bar segment light-emitting diode array forming a part of the display of the wristwatch of FIGS. 1 and 2.

In the present embodiment the display takes the form of a seven bar segment array of light-emitting diodes, preferably formed of gallium arsenide phosphide or gallium arsenide which emit light when energized in the visible red region of the spectrum. FIG. 3 shows a single display station or numeral 38 consisting of seven light-emitting diodes 40, 42, 44, 46, 48, 50, and 52 of elongated shape and arranged so that by lighting an appropriate combination of the bars or segments any one of the numbers 0 through 9 may be displayed. While a seven bar segment display is preferred, it is apparent that other type displays, such as a 27 dot matrix display, may be used.

Figure 4:
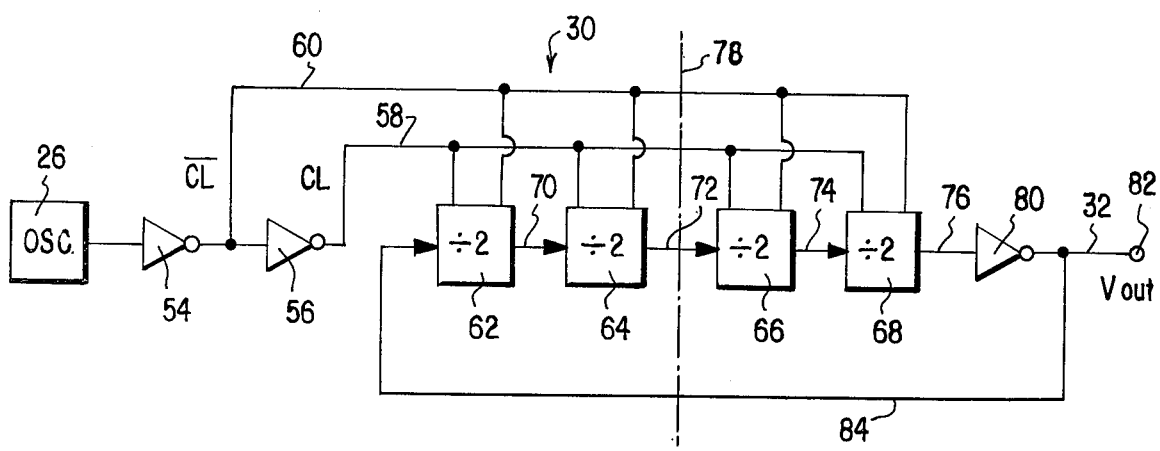
FIG. 4 is a block diagram of the oscillator and divider portions of the wristwatch of FIGS. 1 and 2.

FIG. 4 is a block diagram of the oscillator 26 and divider 30 of FIG. 2. The oscillator or frequency standard 26 supplies a high frequency signal to the frequency converter or divider 30 through a pair of inverters 54 and 56. A clock pulse labelled $\overline{CL}$ is developed at the output of inverter 56 on lead 58 and a complementary clock pulse labelled CL is developed at the output of inverter 54 on lead 60. The clock pulses on lead 58 and the complementary clock pulses on lead 60 are at the frequency of oscillator 26 which by way of example only may be 32,768 Hz.

The clock pulses on leads 58 and 60 are applied to a plurality of flip-flops 62, 64, 66 and 68 which are interconnected as represented by leads 70, 72, and 74 to form a binary frequency counter or divider chain. While only four flip-flop stages are illustrated in FIG. 4, the dash line 78 in that figure indicates that the stages may be repeated to any desired number to produce the desired binary division of the clock pulse frequency so that the output pulses are at a lower frequency useable by the display actuator 34 of FIG. 2 to drive the time display of the wristwatch. For an oscillator 26 operating at the frequency of 32,768 Hz divider 30 is provided with 15 divider stages to produce an output frequency of 1 Hz. In the preferred embodiment divider 30 has 14 stages and an 8 Hz output from the divider is passed through further divider stages to produce a 1 Hz output for the seconds display. The output from the last stage 68 of divider 30 is applied over a lead 76 to an output inverter 80. This inverter has its output on lead 32 connected to output terminal 82 which feeds the display actuator 34 of FIG. 2. The output on lead 32 is also fed back by way of a lead 84 as an input to the first stage 62 of divider 30.

FIG. 5 is a detailed circuit diagram showing four stages of the divider 30 of FIG. 4 and like parts bear like reference numerals. Each stage of the divider 30 is identical so that only the first stage 62 will be described in detail. This stage comprises a pair of PMOS enhancement transistors 86 and 88 with the gate of transistor 86 connected to clock lead 58 and the gate of transistor 88 connected to the complementary clock lead 60. The inherent gate to drain capacitance of the PMOS transistors are shown by the dash line capacitors 90 and 92 and the transistors are interconnected from the drain of a preceding transistor to the source of the next succeeding transistor by leads 94 and 96. While the transistors are illustrated in FIG. 5 as discrete elements it is understood that in the preferred embodiment they are constructed as integrated circuits. The substrate of each PMOS transistor in the divider is connected to terminal 98 which constitutes the positive supply terminal for a conventional two cell wristwatch power supply battery, the other side or negative side of the battery being grounded. The drain of the last transistor of the last stage of the divider is connected to the complementary gates of inverter 80 which comprises a conventional CMOS inverter having a P-channel MOS transistor and an N-channel MOS transistor connected with their sources to opposite sides of the power supply battery. The output is taken from the common drain connection of the inverter 80 by way of lead 32 to the output terminal 82. The inverter output is also applied by way of lead 84 to the source of input transistor 86 in the first stage of the divider.

FIG. 6 shows the oscillator 26 and the inverters 54 and 56 for obtaining the clock pulses on leads 58 and 60. Inverters 54 and 56 again comprise conventional CMOS inverters with their sources connected across the 3.2 volt battery power supply. The clock pulse on lead 58 is derived from the common drain connection of CMOS inverter 56 and the complementary clock pulse on lead 60 is derived from the common drain connection of the CMOS transistors forming inverter 54.

Oscillator 26 preferably comprises a CMOS inverter 100 utilized as an oscillator with a piezoelectric quartz crystal 102 connected between the common drain output of the oscillator and the complementary gates of inverter 100. In parallel with the oscillator is a 20 megohm resistor 104 and connecting opposite sides of the crystal to ground is a pair of 10 pf capacitors 106 and 108. A 50 kilohm resistor 110 connects one side of the crystal to the oscillator output lead 112. A pair of 100 kilohm resistors 114 and 116 connect the sources of the transistors of inverter 100 to the opposite sides of the power supply so that resistors 114 and 116 act as current limiting resistors to reduce current flow during switching. The transistor substrates are returned to the opposite sides of the power supply by leads 118 and 120.

In operation, oscillator 26 produces an output at the common drain lead 112 at a frequency of 32,768 Hz and this passes through CMOS inverters 54 and 56 to produce a series of clock pulses at that frequency on the clock leads 58 and 60. The voltage waveforms for the clock pulses on leads 58 and 60 are shown respectively at 122 and 124 in FIG. 7. Inverter 80 induces a charge signal on the first transistor 86 of the first divider stage by way of feedback lead 84. Assuming that this charge signal can be represented by a positive going voltage, this positive voltage step propagates by charge coupling through the successive stages of the divider at a rate determined by the frequency of the clock pulses. Again, assuming a charge signal which may be represented by a positive going voltage step, when the last stage of the divider changes state the signal is inverted in inverter 80 to produce a negative step on lead 32. This negative step is fed back over lead 84 and is applied as an input to the first stage of the divider. The negative step or negative wave front then propagates through the divider with the transistors charge coupled at the clock frequency rate until the negative step appears at the output, is inverted in 80 and fed back to the input stage of the divider such that the cycle repeats. The resulting voltage waveform appearing at output terminal 82 is illustrated in FIG. 7 by the substantially square wave output 126 having a frequency which is a binary sub-multiple of the clock frequency of waveforms 122 and 124 such that the frequency of waveform 126 is the clock frequency divided by $2n$ where $n$ is the number of stages in divider 30.

It is apparent from the above that the present invention provides an improved solid state watch construction and particularly one incorporating an improved charge coupled divider. Although the specific embodiment of the divider has been described in conjunction with the use of PMOS transistors, it is understood that the charge coupled divider may be formed using NMOS or complementary symmetry MOS transistors. Also, while the wristwatch has been described in conjunction with a light-emitting diode display, it is understood that other display devices may be utilized such as a conventional watch hand display driven by an electro-mechanical transducer or other electro-optical displays such as liquid crystals and the like may be utilized. Likewise while the invention has been described in conjunction with a specific oscillator, it is understood that an important feature of the present invention is the provision of a dynamic divider construction which draws relatively little power even at very high frequencies so that by providing a suitable number of stages of the present invention may be used with much higher frequency inputs such as those on the order of several megahertz. Since the signal is transferred along the divider chain by charge coupling the transistors of the divider are not connected across the power supply and as a result the transistors forming the binary stages of divider 30 draw very little current and impart very little power drain on the wristwatch battery. This is particularly significant for the higher frequency stages where in the past rapid switching at higher frequencies has increased the power drain in the earlier stages of the divider.

An additional advantage offered by the charge coupling circuit divider of the present invention resides in the fact that only a single stage of the divider changes state during each clock cycle. This further helps to reduce the power drain and is clearly distinguishable from other divider constructions in which practically all of the divider stages change state at certain times during a counting cycle when a clock or input pulse is applied to the divider.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A wristwatch comprising a source of substantially constant frequency electrical signals, a divider coupled to the output of said source, a time display, and a display actuator coupling said divider to said display, said divider comprising a plurality of stages of charge coupled transistors, clock means coupling said source of substantially constant frequency electrical signals to each of said stages for causing a charge signal to propagate along the stages of said divider at a rate determined by the frequency of said electrical source, a complementary symmetry MOS inverter coupled between the first and last of said stages for feeding a signal which is the inverse of the state of said last stage back to said first stage, and means for coupling the output of said inverter to the input of said display actuator.

2. A wristwatch according to claim 1 wherein said constant frequency complementary symmetry MOS source comprises a high frequency oscillator.

3. A wristwatch according to claim 2 wherein said oscillator comprises a crystal controlled oscillator.

4. A wristwatch according to claim 1 wherein said clock means includes means for producing clock signals at the frequency of said constant frequency source.

5. A wristwatch according to claim 4 wherein said clock means comprises at least one inverter coupled to said constant frequency source.

6. A wristwatch according to claim 1 wherein said clock means includes means for applying a two phase clock signal to each of said divider stages.

7. A wristwatch according to claim 6 wherein each stage comprises a single pair of MOS transistors, said clock signals being applied to the gates of said transistors.

8. A wristwatch according to claim 7 wherein the source-drain circuits of said transistors are coupled together for charge transfer, said complementary symmetry MOS inverter being coupled to the source-drain circuit of the first transistor of said first stage.

9. A wristwatch according to claim 8 including a power supply terminal, and means coupling the substrate of each of said transistors to said power supply terminal.

10. A wristwatch according to claim 9 wherein said transistors are formed as P-channel integrated circuit devices.

* * * * *

UNITED STATES PATENT AND TRADEMARK OFFICE
CERTIFICATE OF CORRECTION

PATENT NO. : 3,956,880
DATED : May 18, 1976
INVENTOR(S) : Arthur H. O'Connor

It is certified that error appears in the above-identified patent and that said Letters Patent are hereby corrected as shown below:

Col. 4, line 33, "$\overline{CL}$" should read --CL--;

line 35, "CL" should read --$\overline{CL}$--.

Col. 6, line 37, after "stages" insert --the divider--.

Claim 2, lines 18 and 19, should read --A wristwatch according to claim 1 wherein said constant frequency source comprises a high frequency complementary symmetry MOS oscillator--.

Signed and Sealed this

Thirty-first Day of August 1976

[SEAL]

Attest:

RUTH C. MASON
Attesting Officer

C. MARSHALL DANN
Commissioner of Patents and Trademarks